United States Patent
Goeke

(10) Patent No.: US 7,614,274 B1
(45) Date of Patent: Nov. 10, 2009

(54) METHOD FOR CALIBRATION ADJUSTMENT VERIFICATION

(75) Inventor: Wayne C. Goeke, Hudson, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 269 days.

(21) Appl. No.: 11/716,430

(22) Filed: Mar. 9, 2007

(51) Int. Cl.
*G01R 17/14* (2006.01)
(52) U.S. Cl. ........................................ 73/1.88
(58) Field of Classification Search ............... 73/1.88; 702/155, 199
See application file for complete search history.

(56) References Cited

U.S. PATENT DOCUMENTS

| | | | |
|---|---|---|---|
| 4,166,974 A | * | 9/1979 | Vermeers .................... 324/679 |
| 4,260,942 A | * | 4/1981 | Fleming ..................... 318/565 |
| 4,866,644 A | * | 9/1989 | Shenk et al. ................. 356/319 |

* cited by examiner

*Primary Examiner*—Hezron Williams
*Assistant Examiner*—Alex DeVito
(74) *Attorney, Agent, or Firm*—Pearne & Gordon LLP

(57) ABSTRACT

A method for verifying the adjustment of a plurality of measurement instruments includes measuring a first value of an un-verified test value of a parameter with a first measurement instrument; measuring a second value of the same un-verified test value of a parameter with a second measurement instrument; comparing the first value with the second value; and determining an adjustment verification state based on the comparison.

6 Claims, 1 Drawing Sheet

METHOD FOR CALIBRATION ADJUSTMENT VERIFICATION

BACKGROUND OF THE INVENTION

The present invention relates to the calibration of measurement instruments and, in particular, to the verification of the adjustment.

To make meaningful measurements, it is often necessary to adjust the measurement instruments with verified sources of the parameter of interest. However, having a verified source available for many different values is expensive not only for the sources themselves but also for maintaining the sources in a verified state. In addition, logistical issues arise in trying to manage and access the verified sources.

One approach to this problem is to directly adjust the measurement instrument to just one or, at most, a few verified sources and then, based on knowledge of the internal circuitry and ranges of the instrument, to adjust other values/ranges to "calibration" by comparing them to the adjusted values in the instrument. However, this depends on the assumptions based on this knowledge being true and accurate and staying true and accurate. Without a verified source for each value of interest, it is not certain what the state of verification actually is for an instrument that employs this indirect adjustment.

SUMMARY OF THE INVENTION

A method for verifying the adjustment of a plurality of measurement instruments includes measuring a first value of an un-verified test value of a parameter with a first measurement instrument; measuring a second value of the same un-verified test value of a parameter with a second measurement instrument; comparing the first value with the second value; and determining an adjustment verification state based on the comparison.

DESCRIPTION OF THE PREFERRED EMBODIMENTS

Figure 1:
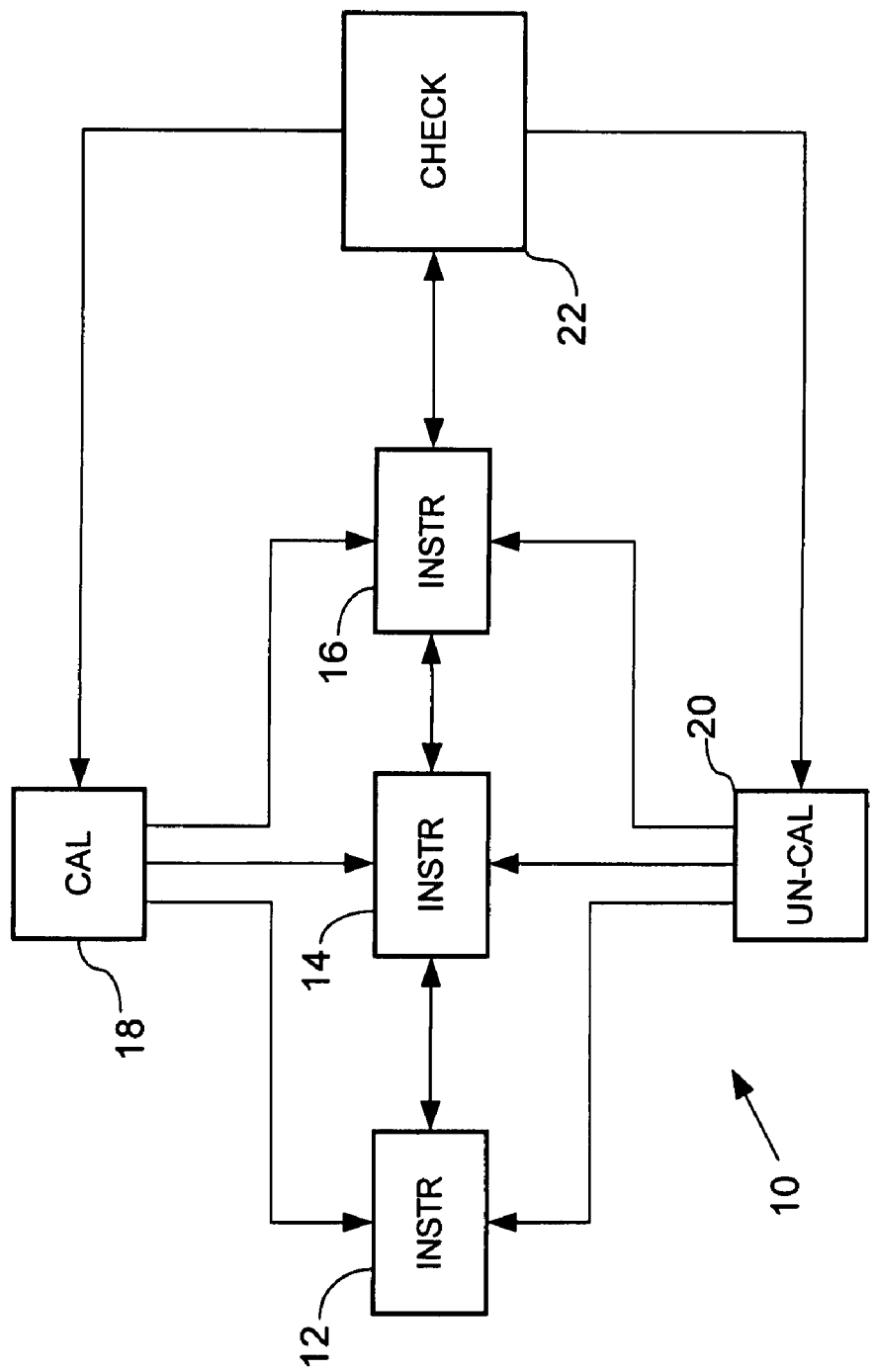
FIG. 1 is block diagram of an example of a measurement instrument constellation according to an aspect of the invention.

Referring to FIG. 1, a constellation 10 of measurement instruments 12, 14, 16 are connectable to a verified parameter source 18 and an un-verified parameter source 20. All of the devices are in communication with a check controller 22.

The instruments 12, 14, 16 may be, for example, voltmeters, ammeters, source-measure units, ohmmeters, inductance meters, capacitance meters, frequency meters, as well as any other electrically operated measurement instrument requiring adjustment. The instruments 12, 14, 16 do not have to be the same kind of instrument as long as the instruments can all make the desired measurements. In addition, one or more of the instruments may incorporate the sources 18, 20.

The verified parameter source 18 provides verified test values of the parameter being measured by the instruments 12, 14, 16. The un-verified parameter source 20 provides un-calibrated test values of the parameter being measured by the instruments 12, 14, 16. As used herein, a verified test value means a value that is known to be accurate to a desired specification and an un-verified test value means a value that is not known to be accurate to a desired specification. An adjusted measurement instrument is a measurement instrument that has been adjusted to correspond to a verified test value.

The check controller 22 may be, for example, a separate controller/computer communicating with the devices or a programmed function within one or more of the devices. It is also possible but less desirable for the controller to be a manual function performed by an operator. In the case of a machine implementation, the devices may communicate, for example, over a network-type communication link or dedicated links for the specific purpose. The communication permits the control of the devices and the exchange of data.

As an example, each of the instruments 12, 14, 16 will be adjusted for one value with reference to the verified parameter source 18. Then other values of the instruments 12, 14, 16 are adjusted based on knowledge of the internal circuitry and ranges of the instrument. For example, a voltmeter may be adjusted to measure 10 volts when a verified 10 volt signal is applied. Then internal circuitry of the voltmeter may generate a scaled version of 10 volts based on the voltmeter's 10-volt adjustment to provide a 100 volt signal to adjust a 100 volt value in the same or, more likely, different range of the voltmeter.

Rather than being based directly on a verified test value these other values depend on the accuracy and reliability of the assumptions made based on knowledge of the instrument. However, this permits the number of verified sources to be minimized along with the attendant maintenance of the sources.

It is statistically expected that the internally generated adjustments will conform to the desired specifications, but absent direct measurement of a verified source, there is uncertainty.

To limit this uncertainty, the un-verified parameter source 20 is used to provide a test value in the general vicinity of what would be a desired verified value.

Each of the instruments 12, 14, 16 measure this un-verified value. If all of the instruments 12, 14, 16 are operating in accordance with the assumptions, the measurements will be within an expected range of each other. On the other hand, if one or more of the instruments has diverged from the assumptions (e.g., components drifted in value or failed), the measured values will be dissimilar.

Comparing the measurements of two instruments can detect a problem in adjustment. Comparing three or more instruments can indicate which instrument has a problem. The probability of correctly detecting and identifying the instrument(s) with a problem increases with the number of instruments compared.

As an example with three measurement instruments, a first range of the instrument 12 can be adjusted by comparing the measured value to a verified test value from the verified parameter source 18. Then a second range of the measurement instrument 12 can be adjusted based on the first adjustment. A first range of the instrument 14 can be adjusted by comparing the measured value to a verified test value from the verified parameter source 18. Then a second range of the measurement instrument 14 can be adjusted based on the first adjustment. A first range of the instrument 16 can be adjusted by comparing the measured value to a verified test value from the verified parameter source 18. Then a second range of the measurement instrument 16 can be adjusted based on the first adjustment. The verified test value may be the same or different for each of the instruments 12, 14, 16.

The first adjustments directly using the verified test value are certain, but the second adjustments based on the first adjustment plus knowledge of the internal circuitry and ranges of the instrument are not.

To verify the adjustment of the second adjustments, a first value in the second range of the measurement instrument 12 is established by measuring an un-verified test value of a parameter from the un-verified test parameter source 20. A second value in the second range of the measurement instrument 14 is established by measuring the same un-verified test value of a parameter from the un-verified test parameter source 20. A third value in the second range of the measurement instrument 18 is established by measuring the same un-verified test value of a parameter from the un-verified test parameter source 20.

The first, second and third values are then compared. Based on this comparison, the adjustment of the second ranges can be verified, that is, a verification state can be determined. For example, if the values are all identical (or identical within the desired accuracy), this indicates all of these ranges are adjusted. If one of the values is divergent, this indicates the respective instrument is not verifiably adjusted. As mentioned above, this process can be performed with as little as two measurement instruments (this provides an indication of at least one the instruments being not verifiably adjusted, but no information on which one), but the more instruments included, the greater the probability that the verification state of all the instruments will be correctly determined.

If should also be noted that this method can also be used to determine the verification state of the original reference-based adjustments.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method for verifying the adjustment of a plurality of measurement instruments, said method comprising:
    measuring a first value of an un-verified test value of a parameter with a first measurement instrument;
    measuring a second value of the same un-verified test value of a parameter with a second measurement instrument;
    comparing said first value with said second value; and
    determining an adjustment verification state based on said comparison.

2. A method according to claim 1, further comprising:
    measuring at least one additional value of the same un-verified test value of a parameter with a respective at least one additional measurement instrument;
    further comparing said at least one additional value with said first value and said second value; and
    determining said adjustment verification state based on said further comparison.

3. A method for verifying the adjustment of a plurality of measurement instruments, said method comprising:
    adjusting a first range of a first measurement instrument with a first verified test value of a parameter;
    adjusting at least one additional instrument range of said first measurement instrument based on said first range of said first measurement instrument;
    adjusting a first range of a second measurement instrument with a second verified test value of a parameter;
    adjusting at least one additional instrument range of said second measurement instrument based on said first range of said second measurement instrument;
    measuring a first value in one of said additional instrument ranges of said first measurement instrument of an un-verified test value of a parameter with said first measurement instrument;
    measuring a second value in one of said additional instrument ranges of said second measurement instrument of the same un-verified test value of a parameter with a second measurement instrument;
    comparing said first value with said second value; and
    determining an adjustment verification state based on said comparison.

4. A method according to claim 3, further comprising:
    adjusting a first range of at least one additional measurement instrument with an additional verified test value of a parameter;
    adjusting at least one additional instrument range of said at least one additional measurement instrument based on said first range of said at least one additional measurement instrument;
    measuring at least one additional value of the same un-verified test value of a parameter with said at least one additional measurement instrument;
    further comparing said at least one additional value with said first value and said second value; and
    determining said adjustment verification state based on said further comparison.

5. A measurement instrument constellation comprising a plurality of measurement instruments configured to perform the method of claim 3.

6. A measurement instrument constellation comprising a plurality of measurement instruments configured to perform the method of claim 4.

* * * * *